(12) United States Patent
Pan et al.

(10) Patent No.: US 9,935,081 B2
(45) Date of Patent: Apr. 3, 2018

(54) HYBRID INTERCONNECT FOR CHIP STACKING

(71) Applicant: Taiwan Semiconductor Manufacturing Company, Ltd., Hsin-Chu (TW)

(72) Inventors: Kuo Lung Pan, Hsin-Chu (TW); Yu-Feng Chen, Hsin-Chu (TW); Chen-Shien Chen, Zhubei (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/464,509

(22) Filed: Aug. 20, 2014

(65) Prior Publication Data

US 2016/0056125 A1 Feb. 25, 2016

(51) Int. Cl.
*H01L 23/00* (2006.01)
*H01L 23/48* (2006.01)
(Continued)

(52) U.S. Cl.
CPC ...... *H01L 25/0655* (2013.01); *H01L 21/4853* (2013.01); *H01L 21/76898* (2013.01); *H01L 23/481* (2013.01); *H01L 23/49811* (2013.01); *H01L 23/49827* (2013.01); *H01L 24/13* (2013.01); *H01L 24/14* (2013.01); *H01L 24/17* (2013.01); *H01L 24/24* (2013.01); *H01L 24/73* (2013.01); *H01L 24/81* (2013.01); *H01L 24/82* (2013.01); *H01L 24/92* (2013.01); *H01L 25/0652* (2013.01); *H01L 25/50* (2013.01); *H01L 2224/13009* (2013.01);
(Continued)

(58) Field of Classification Search
CPC ............... H01L 25/042; H01L 25/0652; H01L 25/0655; H01L 25/071; H01L 25/072; H01L 25/0753; H01L 2224/1403; H01L 2224/1703; H01L 23/481; H01L 23/49827; H01L 2224/13082; H01L 2225/06517; H01L 2225/06513; H01L 2225/06541–2225/06544
See application file for complete search history.

(56) References Cited

U.S. PATENT DOCUMENTS

2001/0045611 A1* 11/2001 Clatanoff .......... H01L 23/49816
257/449
2006/0226527 A1* 10/2006 Hatano ............... H01L 23/5389
257/686

(Continued)

*Primary Examiner* — Kevin Parendo
(74) *Attorney, Agent, or Firm* — Slater Matsil, LLP

(57) ABSTRACT

Methods of packaging semiconductor devices and structures thereof are disclosed. In one embodiment, a method of packaging a semiconductor device includes providing a substrate, and adhering a first semiconductor device. Chip stacks are formed by providing a plurality of semiconductor devices and bonding them to the substrate and the first semiconductor device. At least one of the provided semiconductor devices is physically connected to both the substrate and the first semiconductor device it is stack on. Other semiconductor devices may stacked by forming conductive channels in the first semiconductor device, and placing the other semiconductor devices in physical contact with the first semiconductor device and the conductive channels.

20 Claims, 7 Drawing Sheets

(51) Int. Cl.
*H01L 23/498* (2006.01)
*H01L 25/00* (2006.01)
*H01L 25/065* (2006.01)
*H01L 21/48* (2006.01)
*H01L 21/768* (2006.01)

(52) U.S. Cl.
CPC ............... *H01L 2224/13082* (2013.01); *H01L 2224/13147* (2013.01); *H01L 2224/1403* (2013.01); *H01L 2224/16145* (2013.01); *H01L 2224/16227* (2013.01); *H01L 2224/1703* (2013.01); *H01L 2224/32225* (2013.01); *H01L 2224/73204* (2013.01); *H01L 2224/73209* (2013.01); *H01L 2224/73253* (2013.01); *H01L 2224/81191* (2013.01); *H01L 2224/81815* (2013.01); *H01L 2224/81986* (2013.01); *H01L 2224/8203* (2013.01); *H01L 2224/82105* (2013.01); *H01L 2224/92125* (2013.01); *H01L 2224/92133* (2013.01); *H01L 2224/92242* (2013.01); *H01L 2225/06513* (2013.01); *H01L 2225/06517* (2013.01); *H01L 2225/06541* (2013.01); *H01L 2924/15153* (2013.01); *H01L 2924/15192* (2013.01)

(56) References Cited

U.S. PATENT DOCUMENTS

| | | | |
|---|---|---|---|
| 2009/0051039 A1* | 2/2009 | Kuo | H01L 21/76898 257/774 |
| 2010/0096734 A1* | 4/2010 | Abbott | H01L 21/568 257/666 |
| 2011/0193219 A1* | 8/2011 | Lai | H01L 24/16 257/737 |
| 2012/0126419 A1* | 5/2012 | Kripesh | H01L 24/11 257/774 |
| 2012/0319248 A1* | 12/2012 | Rahman | H01L 23/147 257/621 |
| 2013/0087909 A1* | 4/2013 | Abdul Razak | H01L 24/14 257/737 |
| 2013/0168854 A1* | 7/2013 | Karikalan | H01L 24/49 257/738 |
| 2014/0185264 A1* | 7/2014 | Chen | H01L 23/3128 361/814 |
| 2014/0321803 A1* | 10/2014 | Thacker | G02B 6/4274 385/14 |
| 2014/0321804 A1* | 10/2014 | Thacker | G02B 6/4274 385/14 |
| 2014/0374900 A1* | 12/2014 | Kwon | H01L 23/36 257/737 |

* cited by examiner

HYBRID INTERCONNECT FOR CHIP STACKING

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
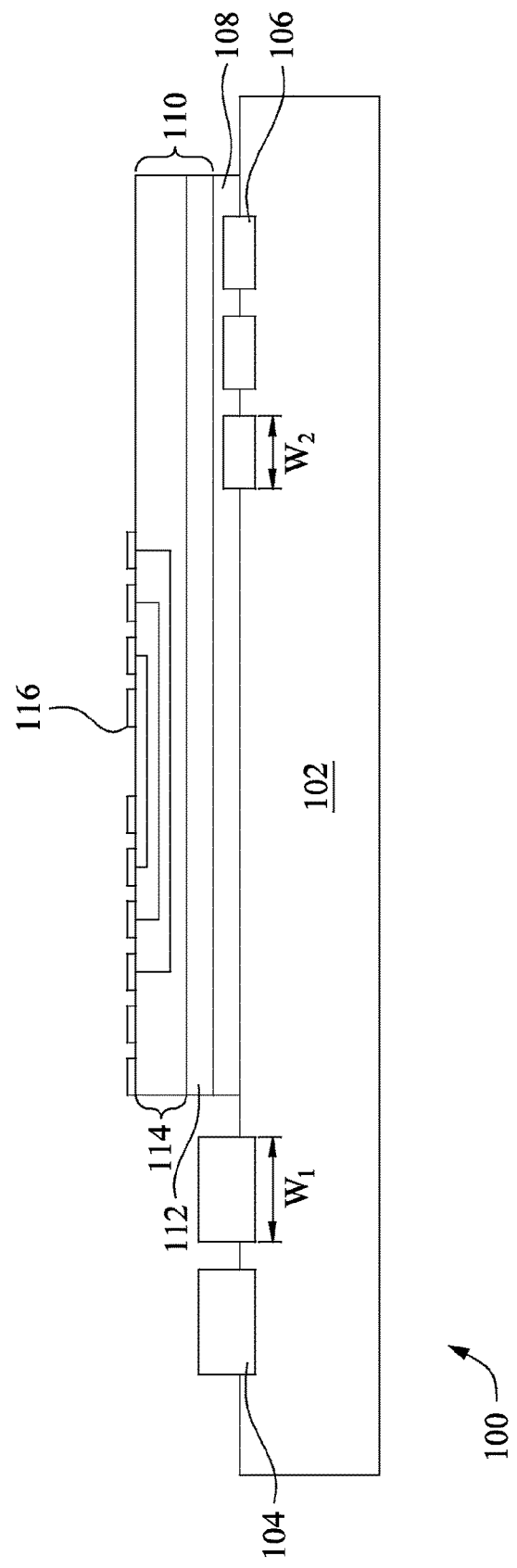
FIG. 1 shows a portion of a chip stack, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a portion of an embodiment of a first chip stack 100. In an embodiment, the first chip stack 100 may at this point comprise a first substrate 102, first contact pads 104, second contact pads 106, an adhesive layer 108, and a first semiconductor device 110. In an embodiment the first substrate 102 may be, e.g., a printer circuit board or a packaging substrate comprising internal interconnects to connect subsequently-attached second semiconductor device 500 and third semiconductor device 514 (not illustrated in FIG. 1, but discussed below with respect to FIG. 5) to external devices (also not illustrated in FIG. 1).

Alternatively, the first substrate 102 may be an interposer used as an intermediate substrate to connect the subsequently-attached second semiconductor device 500 and third semiconductor device 514 to external devices. In this embodiment the first substrate 102 may be, e.g., a silicon substrate, doped or undoped, or an active layer of a silicon-on-insulator (SOI) substrate. However, the first substrate 102 may alternatively be a glass substrate, a ceramic substrate, a polymer substrate, or any other substrate that may provide a suitable protection and/or interconnection functionality. These and any other suitable materials may alternatively be used for the first substrate 102.

The first contact pads 104 may be formed on the first substrate 102 to form electrical connections between the first substrate 102 and the subsequently-attached second semiconductor device 500 (see FIG. 5). The first contact pads 104 may comprise aluminum, but other materials, such as copper, may alternatively be used. The first contact pads 104 may be formed using a deposition process, such as sputtering, to form a layer of material (not shown) and portions of the layer of material may then be removed through a suitable process (such as photolithographic masking and etching) to form the first contact pads 104. However, any other suitable process may be utilized to form the first contact pads 104. In an embodiment the first contact pads 104 may be formed to have a first width $W_1$ of between about 70 µm and 100 µm.

The second contact pads 106 may also be formed on the first substrate 102 to form electrical connections between the first substrate 102 and the subsequently-attached third semiconductor device 514 (see FIG. 5). In an embodiment the second contact pads 106 may be smaller than the first contact pads 104, and are formed to have a second width $W_2$ of between about 50 µm and 70 µm. The second contact pads 106 may be formed using a deposition process, such as sputtering, to form a layer of material (not shown) and portions of the layer of material may then be removed through a suitable process (such as photolithographic masking and etching) to form the second contact pads 106. However, any other suitable process may be utilized to form the second contact pads 106. The second contact pads 106 may be formed in the same process as the first contact pads 104, or may be formed in a separate process.

Once the first contact pads 104 and the second contact pads 106 have been formed, the adhesive layer 108 is placed on the first substrate 102 in order to assist in the adherence of overlying structures (e.g., the first semiconductor device 110). In an embodiment the adhesive layer 108 may comprise a glue. However, other types of adhesives, such as pressure sensitive adhesives, radiation curable adhesives, epoxies, combinations of these, or the like, may also be used. The adhesive layer 108 may be placed onto the first substrate 102 in a semi-liquid or gel form, which is readily deformable under pressure.

In an embodiment, the first semiconductor device 110 is attached to the first substrate 102 by the adhesive layer 108. The first semiconductor device 110 comprises a second substrate 112, optional active devices (not separately illustrated), first metallization layers 114, and third contact pads 116. The second substrate 112 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, glass substrates, ceramic substrates, or hybrid orientation substrates.

The optional active devices within the first semiconductor device 110 may comprise a wide variety of active devices and passive devices such as capacitors, resistors, inductors and the like that may be used to generate the desired structural and functional desires of the design for the first semiconductor device 110. The active devices within the first semiconductor device 110 may be formed using any suitable methods either within or else on the second substrate 112.

The first metallization layers 114 are formed over the second substrate 112 and, if present, the active devices within the first semiconductor device 110 and may be used to interconnect, e.g., the subsequently-attached second semiconductor device 500 to the third semiconductor device 514 (see FIG. 5). In an embodiment the first metallization layers 114 are formed of alternating layers of dielectric and conductive material and may be formed through any suitable process (such as deposition, damascene, dual damascene, etc.). In an embodiment there may be four layers of metallization, but the precise number of layers of dielectric and conductive material is dependent upon the design of the first semiconductor device 110.

The third contact pads 116 may be formed over and in electrical contact with the first metallization layers 114 in order to provide external connections for the first semiconductor device 110. The third contact pads 116 are formed of a conductive material such as aluminum, although other suitable materials, such as copper, tungsten, or the like, may alternatively be utilized. The third contact pads 116 may be formed using a process such as CVD, although other suitable materials and methods may alternatively be utilized. Once the material for the third contact pads 116 has been deposited, the material may be shaped into the third contact pads 116 using, e.g., a photolithographic masking and etching process.

Figure 2:
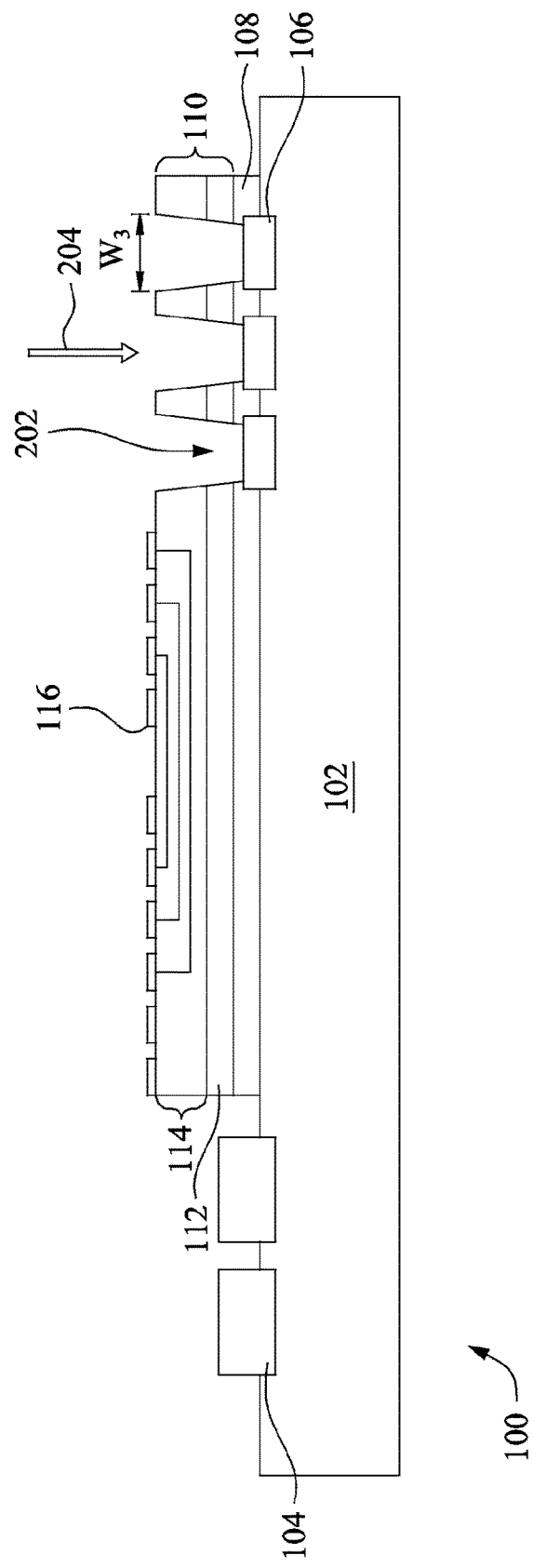
FIG. 2 shows a patterning of openings on the chip stack, in accordance with some embodiments.

Turning now to FIG. 2, there is shown openings 202 patterned in the first semiconductor device 110, which are formed by a removal process 204. In an embodiment, the openings 202 expose the second contact pads 106 through the adhesive layer 108 and the first semiconductor device 110. The openings 202 may be formed with a depth sufficient to extend completely through the adhesive layer 108 and the first semiconductor device 110, and expose the second contact pads 106. In an embodiment the openings 202 may be formed to have a third width $W_3$ at a top of the openings 202 of between about 40 µm and 80 µm, such as about 60 µm. In an embodiment, the openings 202 may be trapezoidal shapes, wherein the top of the opening is wider than the portion exposing the second contact pads 106.

The openings 202 may be formed through the removal process 204 (represented in FIG. 2 by the arrow labeled 204). In one embodiment, the removal process 204 is a laser drilling process. The laser drilling process may be performed using, e.g., a carbon dioxide ($CO_2$) laser, although any suitable laser may alternatively be used. During the laser drilling process the drill energy may be in a range from 0.1 mJ to about 30 mJ, and a drill angle of about 0 degrees (perpendicular to the first semiconductor device 110). In some embodiments, the drill time is in a range from about 1 µs to about 150 µs for each desired opening.

However, as one of ordinary skill in the art will recognize, the laser drilling process described above is only an illustrative embodiment and is not intended to be limiting to the embodiments. Rather, any suitable removal or exposure process may alternatively be used. For example, in other embodiments the removal process 204 may be a masking and plating process during formation of the first semiconductor device 110 (not pictured), a photolithographic masking and etching process after formation, or the like. All such processes are fully intended to be included within the scope of the embodiments.

Figure 3:
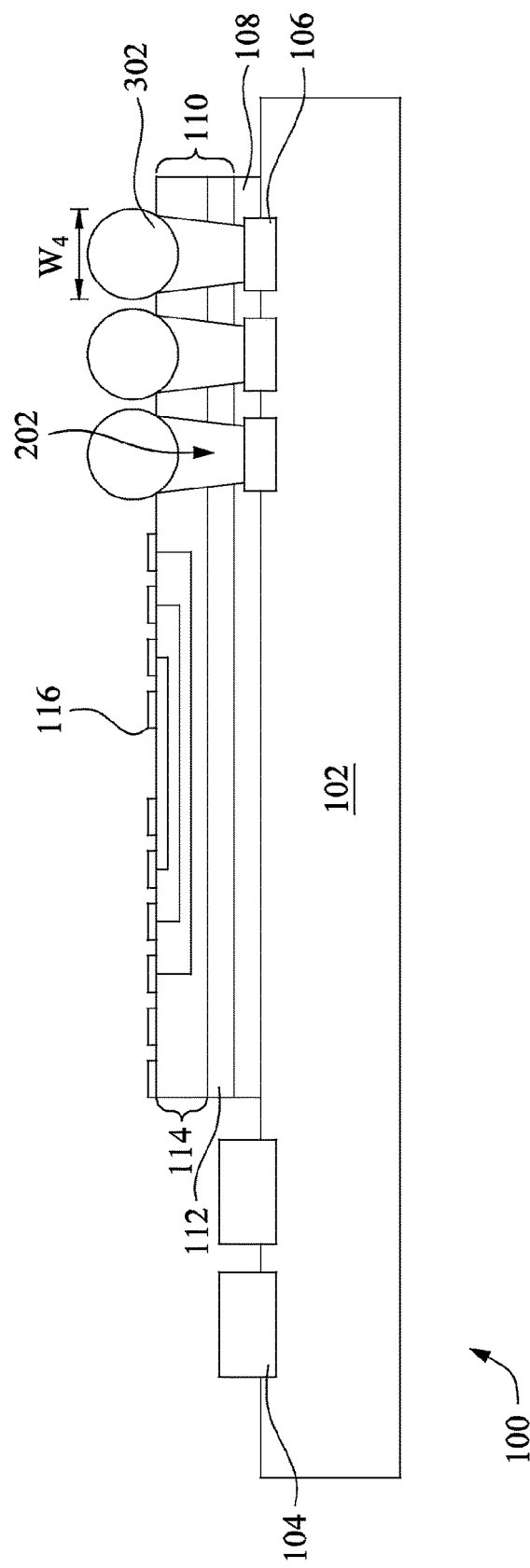
FIG. 3 shows a placement of solder balls on the openings, in accordance with some embodiments.

Turning now to FIG. 3, there is shown a reflowable conductive material 302 formed in the openings 202. In an embodiment, the reflowable conductive material 302 is formed so that it will flow down into the openings 202 when heated. In some embodiments, the reflowable conductive material 302 is chosen so that it is slightly wider than the openings 202. In an embodiment, the reflowable conductive material 302 may be formed to have a fourth width $W_4$ of between about 60 µm and 100 µm, such as about 70 µm. In some embodiments, the reflowable conductive material 302 may comprise solder, such as a Sn—Ag alloy, a Sn—Ag—Cu alloy, or the like, and may be lead-free or lead-containing. Alternatively, the reflowable conductive material 302 may comprise other materials and may be formed using other methods. The reflowable conductive material 302 may be placed using a ball drop or ball mounting process, for example.

Figure 4:
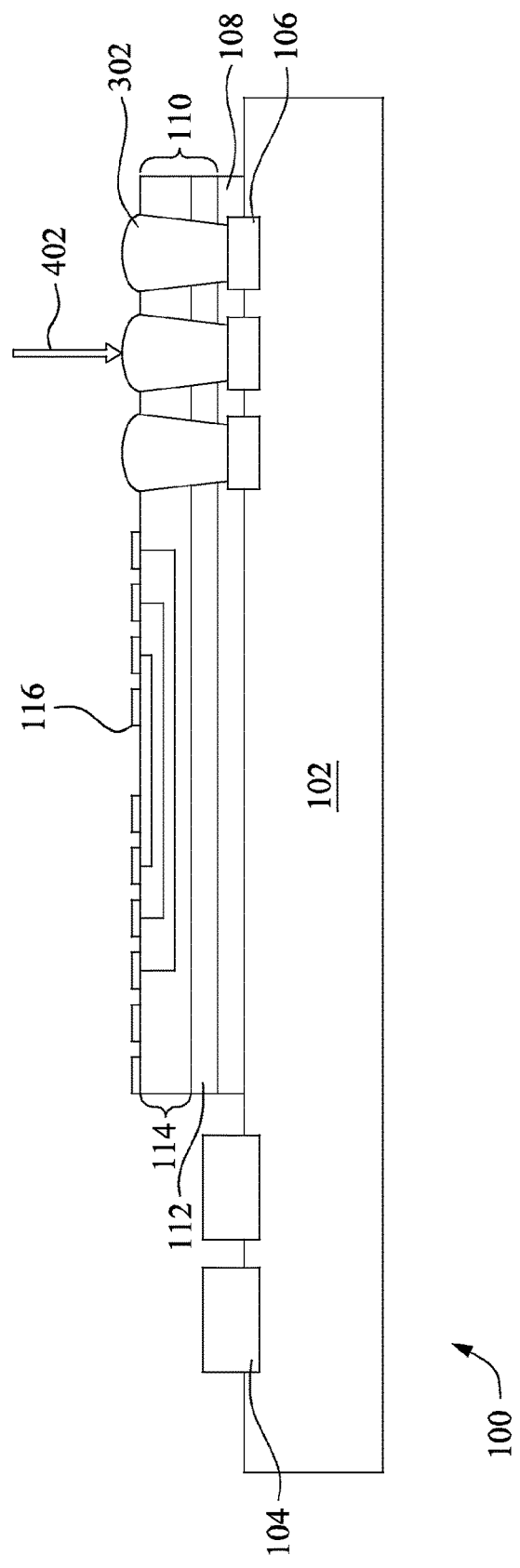
FIG. 4 shows a formation of conductive channels by reflowing the placed solder balls, in accordance with some embodiments.

Turning now to FIG. 4, a reflow process 402 may be performed to cause the reflowable conductive material 302 to fill the openings 202, and be in contact with the second contact pads 106. In the reflow process the temperature of the reflowable conductive material 302 may be raised to between about 200° C. and about 260° C., such as about 250° C., for between about 10 seconds and about 60 seconds, such as about 35 seconds. This reflow process partially liquefies the reflowable conductive material 302, which then flows into the openings 202 and forms a bump shape due to the surface tension of the reflowable conductive material 302.

Figure 5:
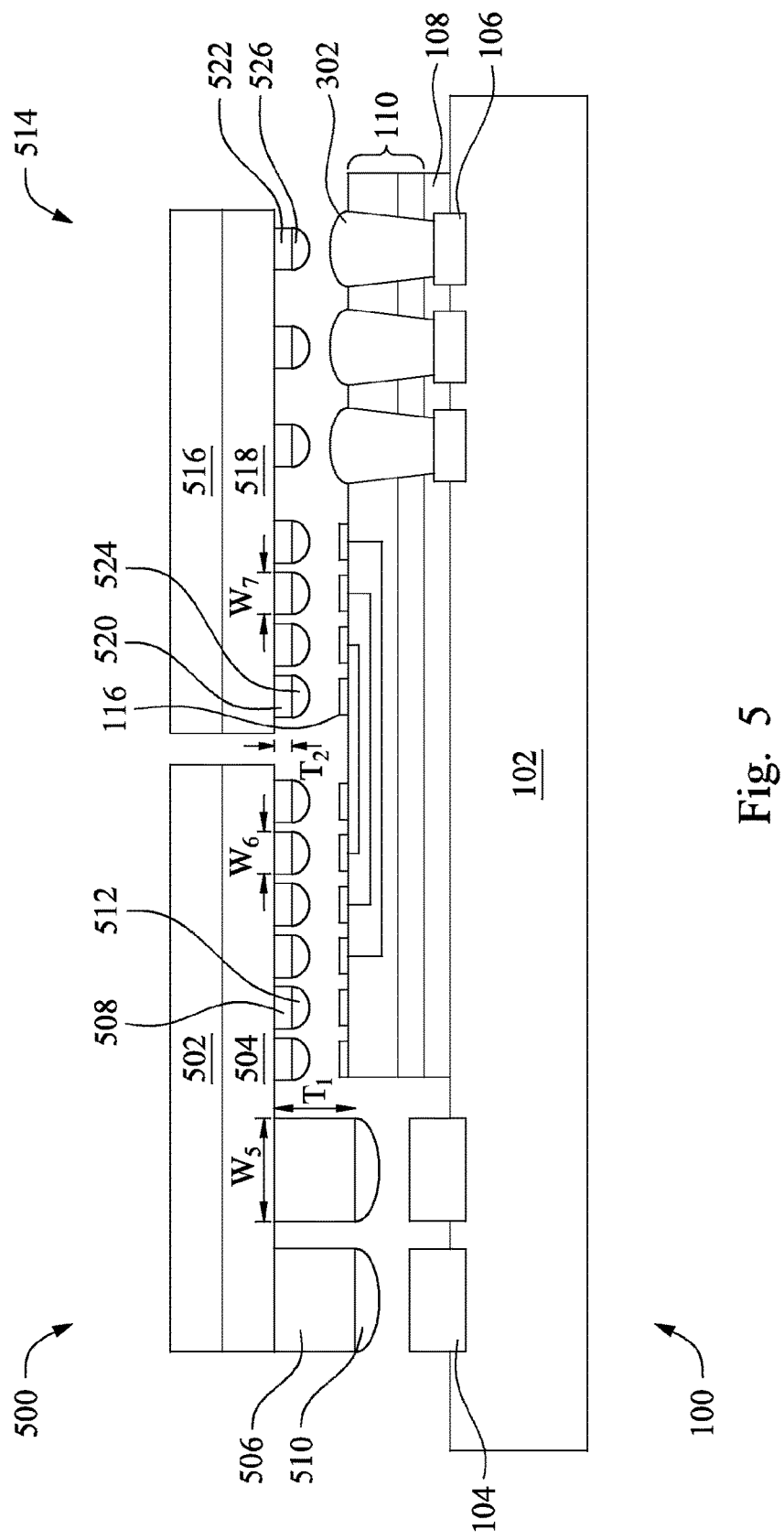
FIG. 5 shows a placement of semiconductor devices on the chip stack, in accordance with some embodiments.

Turning now to FIG. 5, it is shown that the second semiconductor device 500 and the third semiconductor device 514 are placed on top of the first chip stack 100. In some embodiments, the second semiconductor device 500 may be a semiconductor device designed for an intended purpose such as being a logic die, a central processing unit (CPU) die, a memory die, a system-on-chip, combinations of these, or the like. In an embodiment the second semiconductor device 500 is designed and manufactured to work in conjunction with or concurrently with other semiconductor devices (e.g., the third semiconductor device 514).

In an embodiment, the second semiconductor device 500 may comprise a third substrate 502, active devices (not separately illustrated), second metallization layers 504, first conductive pillars 506, second conductive pillars 508, first conductive bumps 510, and second conductive bumps 512. The third substrate 502 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices within the second semiconductor device 500 comprise a wide variety of active devices and passive devices such as capacitors, resistors, inductors and the like that may be used to generate the desired structural and functional desires of the design for the second semiconductor device 500. The active devices within the second semiconductor device 500 may be formed using any suitable methods either within or else on the third substrate 502.

The second metallization layers 504 are formed on the third substrate 502 and the active devices within the second semiconductor device 500 and are designed to connect the various active devices within the second semiconductor device 500 to form functional circuitry. In an embodiment the second metallization layers 504 are formed of alternating layers of dielectric and conductive material and may be formed through any suitable process (such as deposition, damascene, dual damascene, etc.). In an embodiment there may be four layers of metallization separated from the third substrate 502 by at least one interlayer dielectric layer (ILD), but the precise number of second metallization layers 504 is dependent upon the design of the second semiconductor device 500.

The first conductive pillars 506 are formed to provide external connections for the second semiconductor device 500. In an embodiment, the first conductive pillars 506 may carry power and ground signals. In another embodiment, first conductive pillars 506 may carry signals. In one embodiment, the first conductive pillars 506 may be formed to have a fifth width $W_5$ of between about 40 µm and 100 µm, such as about 82 µm.

In an embodiment the first conductive pillars 506 may be formed by initially forming and patterning a photoresist (not shown). The first conductive pillars 506 may be formed within the pattern of the photoresist by first forming a seed layer (not shown) and then forming the first conductive pillars 506 using the seed layer as an initiator. The first conductive pillars 506 may be formed from a conductive material such as copper, although other conductive materials such as nickel, titanium (Ti), vanadium (V), or aluminum (Al), combinations of these, and the like may also be used. Additionally, the first conductive pillars 506 may be formed using a process such as electroplating, whereby a combination of current and immersion within a solution deposit, e.g., copper within the openings in order to fill and/or overfill the openings of the photoresist, thereby forming the first conductive pillars 506. After the first conductive pillars 506 have been formed, the photoresist may be removed. In an embodiment, the first conductive pillars 506 may be formed to have a first thickness $T_1$ of between about 60 µm and 100 µm, such as about 80 µm.

The second conductive pillars 508 are also formed over the second metallization layers 504, using a similar process as the first conductive pillars 506 (e.g., plating process). In an embodiment, the second conductive pillars 508 are smaller than the first conductive pillars 506. For example, the second conductive pillars 508 may be formed to have a sixth width $W_6$ of between about 12 µm and 32 µm, such as about 22 µm, and a second thickness $T_2$ of between about 20 µm and 40 µm, such as about 30 µm.

The first conductive bumps 510 are formed on the first conductive pillars 506. In some embodiments, the first conductive bumps 510 provide electrical connection between the first conductive pillars 506 and the first contact pads 104. In some embodiments, the first conductive bumps 510 may comprise solder. The first conductive bumps 510 may be contact bumps such as ball grid array (BGA) bumps, microbumps, or controlled collapse chip connection (C4) bumps and may comprise a material such as solder, tin, or other suitable materials, such as silver or copper. In an embodiment in which the first conductive bumps 510 are tin solder bumps, the first conductive bumps 510 may be formed by initially forming a layer of tin through any suitable method such as evaporation, electroplating, printing, solder transfer, ball placement, etc. Once a layer of tin has been formed on the structure, a reflow is performed in order to shape the material into the desired bump shapes.

The second conductive bumps 512 are formed on the second conductive pillars 508. The steps of forming the second conductive bumps 512 may be similar to the steps discussed in the preceding paragraphs and, as such, are not repeated herein. In some embodiments the second conductive bumps 512 are formed by the same process as the first conductive bumps 510. Alternatively, they may be formed in a separate process. For example, in a particular embodiment, the first conductive bumps 510 may be C4 bumps while the second conductive bumps 512 may be microbumps.

Turning now to the third semiconductor device 514, in some embodiments the third semiconductor device 514 may be designed for an intended purpose such as being a logic die, a central processing unit (CPU) die, a memory die, a system-on-chip, combinations of these, or the like. In an embodiment the third semiconductor device 514 is designed and manufactured to work in conjunction with or concurrently with other semiconductor devices (e.g., the second semiconductor device 500).

In some embodiments, the second semiconductor device 500 may comprise a fourth substrate 516, active devices (not separately illustrated), third metallization layers 518, third conductive pillars 520, fourth conductive pillars 522, third conductive bumps 524, and fourth conductive bumps 526. In an embodiment, the third semiconductor device 514 may be formed using similar materials and processes as the second semiconductor device 500, and the fourth substrate 516 may be formed using similar materials and processes as the third substrate 502. Additionally, the third metallization layers 518 may be formed using similar materials and processes as the second metallization layers 504.

The third conductive pillars 520 and the fourth conductive pillars 522 are formed on the third semiconductor device 514 to provide external connections using, e.g., a masking and plating process. In an embodiment, the fourth conductive pillars 522 may be substantially the same width as the third conductive pillars 520. For example, the third conductive pillars 520 and the fourth conductive pillars 522 may both be formed to have a seventh width $W_7$ of between about 12 µm and 32 µm, such as about 22 µm. In some embodiments, the third conductive pillars 520 may be grouped separately from the fourth conductive pillars 522, in order to couple the third semiconductor device 514 to more than one device.

After forming the third conductive pillars 520 and the fourth conductive pillars 522, the third conductive bumps 524 and fourth conductive bumps 526 are formed. The steps of forming the conductive bumps may be similar to the steps discussed previously with respect to the first conductive bumps 510, and as such are not repeated herein. In some embodiments, the third conductive bumps 524 may be formed in the same or a different process than the fourth conductive bumps 526.

After formation, the second semiconductor device 500 and the third semiconductor device 514 may be tested before being placed on the first chip stack 100, so that known good semiconductor devices (discussed below) and device packages may be used. For example the second semiconductor device 500 and third semiconductor device 514 may be tested by a probe card. However, one having ordinary skill in the art will appreciate that a wide variety of device testing methods exist, and any suitable device testing process may alternatively be used. All such processes are fully intended to be included within the scope of the embodiments.

Once formed and tested, the second semiconductor device 500 and the third semiconductor device 514 may be coupled to the first chip stack 100 using a flip-chip mounting process in some embodiments. For example, the second semiconductor device 500 may be manufactured in a separate process then inverted, and the plurality of the first conductive pillars 506 and the second conductive pillars 508 then coupled to the first chip stack 100.

Likewise, the third semiconductor device 514 may also be manufactured in a separate process and then inverted and coupled to the first chip stack 100. The third semiconductor device 514 may be formed in a similar manner to the second semiconductor device 500. In some embodiments, the third conductive pillars 520 may be coupled to the third contact pads 116, and the fourth conductive pillars 522 may be coupled to the reflowable conductive material 302.

In an embodiment, the second semiconductor device 500 may be placed such that the second semiconductor device 500 overhangs the first semiconductor device 110. In such an embodiment, only some of the conductive pillars of the second semiconductor device 500 may be in contact with the first semiconductor device 110. For example, the first conductive pillars 506 may be in electrical contact with the first substrate 102 through the first contact pads 104, and the second conductive pillars 508 may be in electrical contact with the first semiconductor device 110 by way of the third contact pads 116.

In some embodiments, only a portion of the conductive pillars of the third semiconductor device 514 may electrically connect to the third contact pads 116. For example, the third conductive pillars 520 may be in electrical contact with the third contact pads 116 through the third conductive bumps 524. The remaining conductive pillars, e.g. the fourth conductive pillars 522, may be in electrical contact with the second contact pads 106, through the fourth conductive bumps 526 and the reflowable conductive material 302.

Figure 6:
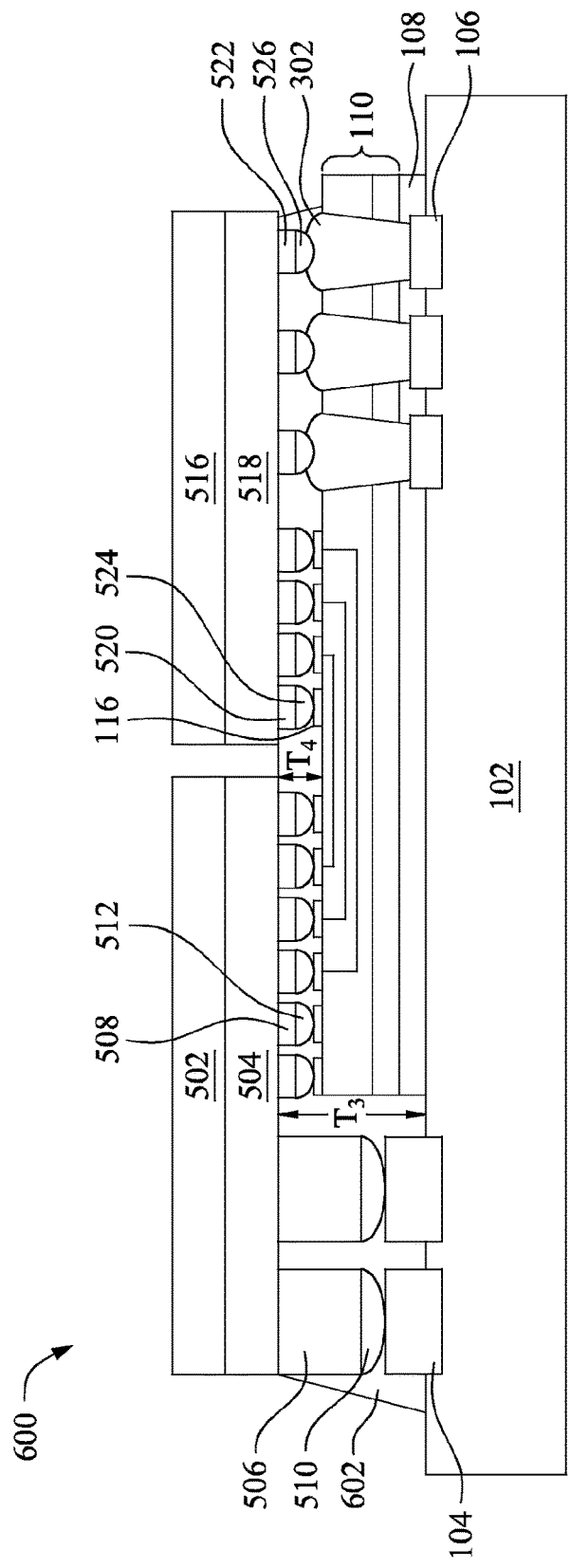
FIG. 6 shows the chip stack with an underfill, in accordance with some embodiments.

Turning now to FIG. 6, it is shown that the second semiconductor device 500 and the third semiconductor device 514 are bonded to the first semiconductor device 110 and the first substrate 102 to form a second chip stack 600. In an embodiment, the first conductive bumps 510 are in physical contact with the first contact pads 104. Similarly, the second conductive bumps 512 and third conductive bumps 524 are in physical contact with the third contact pads 116. Finally, the fourth conductive bumps 526 are in physical contact with the reflowable conductive material 302.

Once they are in contact on the first chip stack 100, the second semiconductor device 500 and third semiconductor device 514 are bonded to the first chip stack 100 by reflowing the first conductive bumps 510, the second conductive bumps 512, the third conductive bumps 524, and the fourth conductive bumps 526. In an embodiment, the reflow process may be heating. In this process, the temperature is raised to a suitable temperature such that the conductive bumps (e.g. first conductive bumps 510) will reflow. This reflow will bond all the conductive pillars to their corresponding contacts. For example, the first conductive pillars 506 will be bound to and electrically connected to the first contact pads 104. In the reflow process the temperature of all the conductive bumps may be raised to between about 200° C. and about 260° C., such as about 250° C., for between about 10 seconds and about 60 seconds, such as about 35 seconds. This reflow process partially liquefies the conductive bumps, which then bond with the contact pads when cooled.

Once the second semiconductor device 500 and the third semiconductor device 514 are bonded to the first chip stack 100, an underfill 602 is injected into the second chip stack 600. In an embodiment, the underfill 602 is an epoxy and may be dispensed in a liquid state and then cured, prior to placing devices on it. The underfill 602 may be cured in order to harden it and provide additional protection to the second semiconductor device 500 and third semiconductor device 514. In an embodiment the curing may be performed by placing the second chip stack 600 into a furnace or other device in order to raise the temperature of the underfill 602 so as to cure the underfill. For example, in an embodiment in which the underfill 602 is an epoxy, the underfill 602 may be cured at a temperature of between about 100° C. and about 200° C., such as about 150° C., for a time of between about 5 hours and about 1 hour, such as about 2 hours.

In some embodiments, the underfill 602 may have varying thicknesses due to the stacking of different semiconductor devices. For example, the underfill may have a third thickness $T_3$ where the second semiconductor device 500 is bonded to the first substrate 102. The third thickness $T_3$ may be between about 80 µm and 120 µm, such as about 100 µm. Conversely, the underfill may be thinner elsewhere, e.g., the underfill may have a fourth thickness $T_4$ where the third semiconductor device 514 is bonded to the first semiconductor device 110. The fourth thickness $T_4$ may be between about 20 µm and 50 µm, such as about 35 µm.

Several cost savings are achieved by partially overhanging the second semiconductor device 500 over the first semiconductor device 110, or electrically routing a portion of the contact pillars of the third semiconductor device 514 through the first semiconductor device 110. By placing and electrically connecting the semiconductor devices side-by-side, the costs associated with connecting the devices solely with through substrate vias (TSVs) may be avoided. Additionally, by using the hybrid interconnect structure, the second chip stack 600 or the third chip stack 700 may be tested to determine known good semiconductor devices prior to bonding, reducing the defect rate. Further, connecting the power and ground lines to the semiconductor devices with a larger bump size that is not routed through a substrate allows for more reliable powering of the semiconductor devices.

Figure 7:
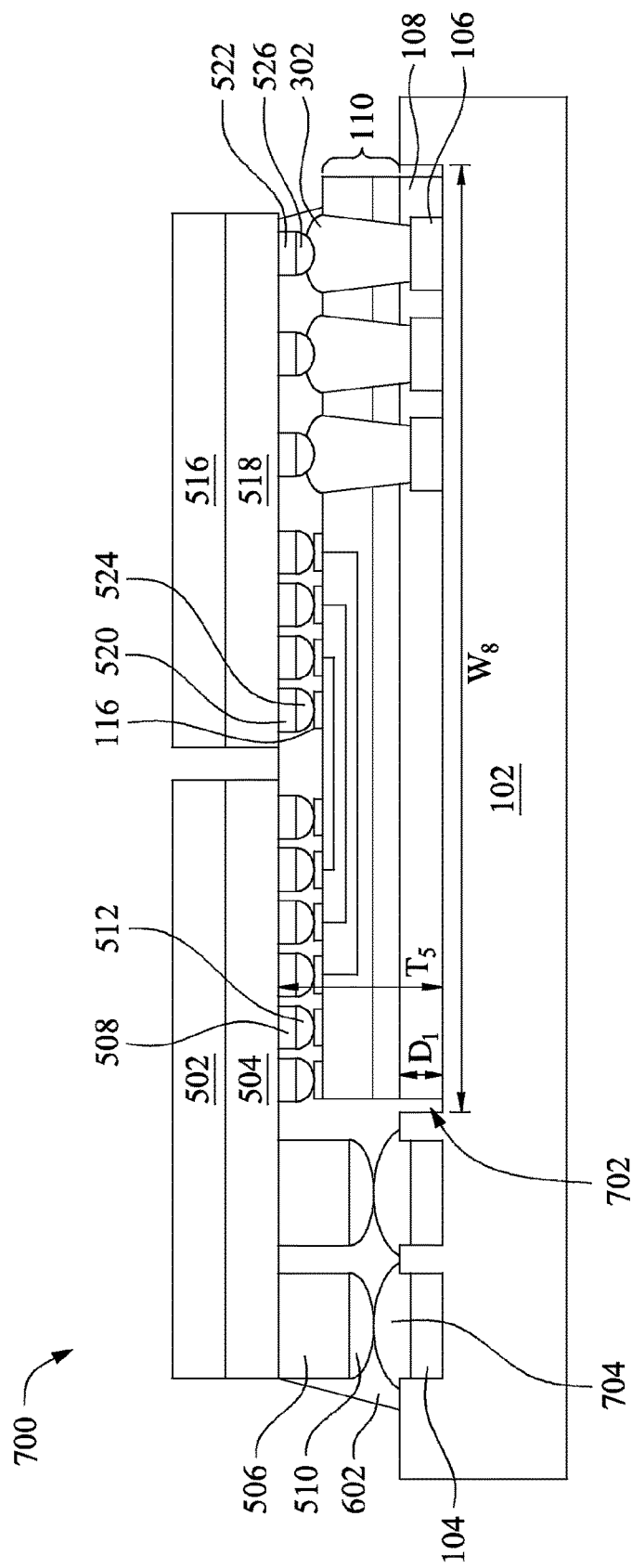
FIG. 7 shows a chip stack recessed in the substrate, in accordance with some embodiments.

Turning now to FIG. 7, another embodiment is shown wherein the first semiconductor device 110 is partially recessed into a device recess 702 in the first substrate 102 to form a third chip stack 700. In an embodiment, the device recess 702 may be formed in the first substrate 102. The adhesive layer 108 may then be formed in the device recess 702 before placing the first semiconductor device 110. The device recess 702 may be sized to accommodate placement of the first semiconductor device 110, such as having a eight width $W_8$ of between about 2 mm and 6 mm, such as about 4 mm, and having a first depth $D_1$ of between about 5 μm and 20 μm, such as about 10 μM.

The first contact pads 104 may be partially or totally recessed in the first substrate 102. The second contact pads 106 may be formed over the first substrate 102, within the device recess 702. In one embodiment, the device recess 702 may be formed by an etching process or a drilling process, and the second contact pads 106 may then be disposed over the etched surface of the first substrate 102. Alternatively, the first contact pads 104 and the second contact pads 106 may be formed and then covered with a layer of material, such as a passivation layer (not separately illustrated). The device recess 702 may then be created by an etching process, wherein the second contact pads 106 are also exposed by the etching. Any suitable method of forming the device recess 702, the first contact pads 104, or the second contact pads 106 may alternatively be utilized.

After formation in the first substrate 102, the first contact pads 104 may have fifth conductive bumps 704 formed on them. Once bonded, the fifth conductive bumps 704 may be in physical contact with the first conductive bumps 510, forming electrical contact between the first contact pads 104 and the first conductive pillars 506. In some embodiments, the fifth conductive bumps 704 may comprise solder. The steps of forming the fifth conductive bumps 704 may be similar to the steps discussed previously with respect to the first conductive bumps 510, and as such are not repeated herein.

In some embodiments, the underfill 602 may, in addition to the third thickness $T_3$ and the fourth thickness $T_4$, have a fifth thickness $T_5$, due to the first semiconductor device 110 being partially recessed in the first substrate 102. For example, the underfill 602 may have a fifth thickness $T_5$ of between about 100 μm and about 140 μm, such as about 120 μm, where the first semiconductor device 110 is bonded to the first substrate 102.

By recessing the first semiconductor device 110 and the first contact pads 104, the first chip stack 100 may be stabilized during placement of the second semiconductor device 500 and the third semiconductor device 514. The walls of the device recess 702 reduce shifting of the first semiconductor device 110, allowing for a lower defect rate in manufacturing. Further, recessing the first semiconductor device creates a lower profile for the third chip stack 700, allowing space savings.

In accordance with an embodiment, a semiconductor package comprising first contact pads over a substrate and second contact pads over the substrate is provided. A first semiconductor device is provided over the second contact pads, and the first semiconductor device has third contact pads. A plurality of conductive channels extend through the first semiconductor device, and are electrically connected to the second contact pads. A second semiconductor device is provided, and portions of it are electrically connected to the first contact pads and the third contact pads. A third semiconductor is provided, and portions of it are electrically connected to the third contact pads and the conductive channels.

In accordance with another embodiment, a semiconductor package comprising a substrate with first contact pads and second contact pads is provided. A first semiconductor device is provided over the substrate. The first semiconductor device has third contact pads, fourth contact pads, and conductive channels. The conductive channels extend from a first side of the first semiconductor device to a second side and are in contact with the first contact pads. A second semiconductor device is provided, comprising first conductive elements coupled to the conductive channels, and second conductive elements coupled to the third contact pads. A third semiconductor device is provided, comprising third conductive elements coupled to the second contact pads and fourth conductive elements coupled to the fourth contact pads.

In accordance with yet another embodiment, a method of manufacturing a semiconductor package comprising forming first contact pads and second contact pads on a substrate, is provided. A first semiconductor device is adhered to the substrate over the second contact pads. A plurality of conductive channels are formed in the first semiconductor device, wherein the conductive channels are electrically connected to the second contact pads. A second semiconductor device is placed over the first semiconductor device, a first portion of the second semiconductor device electrically connected to the first semiconductor device, and a second portion of the second semiconductor device electrically connected to the first contact pads. Finally, a third semiconductor device is placed over the first semiconductor device, a first portion of the third semiconductor device electrically connected to the first semiconductor device, and a second portion of the third semiconductor device electrically connected to the plurality of conductive channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   first contact pads over a first side of a substrate;
   second contact pads over the first side of the substrate, wherein the first contact pads and the second contact pads physically contact a same planar surface of the substrate;
   a first semiconductor device covering the second contact pads, wherein the first semiconductor device has a functional circuit comprising an active device, wherein the first semiconductor device comprises third contact pads on a first side of the first semiconductor device facing away from the substrate, wherein a second side of the first semiconductor device opposing the first side of the first semiconductor device is attached to the first side of the substrate, wherein the first contact pads are laterally removed from the first semiconductor device;
   a plurality of conductive channels extending through the first semiconductor device, wherein the conductive channels are electrically connected to the second contact pads;
   a second semiconductor device over the first semiconductor device and having first conductive pillars and second conductive pillars, wherein a first portion of the second semiconductor device is electrically connected to the third contact pads via the first conductive pillars, and a second portion of the second semiconductor device is electrically connected to the first contact pads via the second conductive pillars, wherein a width of the second conductive pillars is larger than a width of the first conductive pillars; and a third semiconductor device over the first semiconductor device, wherein a first portion of the third semiconductor device is electrically connected to the third contact pads, and a second portion of the third semiconductor device is electrically connected to the conductive channels.

2. The semiconductor package of claim 1, wherein the first contact pads and the second contact pads comprise different sizes.

3. The semiconductor package of claim 1, wherein the first conductive pillars and the second conductive pillars of the second semiconductor device comprise copper.

4. The semiconductor package of claim 1, wherein the first semiconductor device comprises metallization layers that electrically connect the second semiconductor device and the third semiconductor device.

5. The semiconductor package of claim 1, wherein the first semiconductor device is partially recessed in the substrate.

6. The semiconductor package of claim 1, wherein a height of the second conductive pillars is larger than a height of the first conductive pillars.

7. The semiconductor package of claim 6, wherein the second conductive pillars are coupled to power signals or ground signals.

8. The semiconductor package of claim 1, wherein each of the plurality of conductive channels has a first width at a first interface between the plurality of conductive channels and the first side of the first semiconductor device, and wherein each of the plurality of conductive channels has a second width at a second interface between the plurality of conductive channels and the second contact pads, the first width being larger than the second width.

9. The semiconductor package of claim 8, wherein a width of each of the conductive channels decreases continuously from the first interface to the second interface.

10. The semiconductor package of claim 1, wherein the second side of the first semiconductor device is attached to the first side of the substrate via an adhesive layer, wherein the adhesive layer fills a gap between the substrate and the first semiconductor device.

11. The semiconductor package of claim 10, further comprising an underfill between the substrate and the second semiconductor device, and between the substrate and the third semiconductor device, wherein a first sidewall of the adhesive layer is covered by the underfill, and a second sidewall of the adhesive layer opposing the first sidewall is free of the underfill.

12. A semiconductor package comprising:
first contact pads over a first side of a substrate;
second contact pads over the first side of the substrate, wherein the first contact pads and the second contact pads physically contact a same planar surface of the substrate;
a first semiconductor device covering the second contact pads, wherein the first semiconductor device has a functional circuit comprising an active device, wherein the first semiconductor device comprises third contact pads on a first side of the first semiconductor device facing away from the substrate, wherein a second side of the first semiconductor device opposing the first side of the first semiconductor device is attached to the first side of the substrate, wherein the first contact pads are laterally removed from the first semiconductor device;
a plurality of conductive channels extending through the first semiconductor device, wherein the conductive channels are electrically connected to the second contact pads, wherein a width of the conductive channels, measured along a first direction parallel to the first side of the first semiconductor device, decreases along a second direction from the first side of the first semiconductor device to the second side of the first semiconductor device;
a second semiconductor device over the first semiconductor device and having first conductive pillars and second conductive pillars, wherein a first portion of the second semiconductor device is electrically connected to the third contact pads via the first conductive pillars, and a second portion of the second semiconductor device is electrically connected to the first contact pads via the second conductive pillars, wherein a width of the second conductive pillars is larger than a width of the first conductive pillars, wherein there is no conductive channel between the substrate and the first conductive pillars of the second semiconductor device; and
a third semiconductor device over the first semiconductor device, wherein a first portion of the third semiconductor device is electrically connected to the third contact pads, and a second portion of the third semiconductor device is electrically connected to the conductive channels.

13. The semiconductor package of claim 12, wherein each of the conductive channels fills an opening in the first semiconductor device, wherein the opening has a trapezoidal cross-section.

14. The semiconductor package of claim 12, wherein a height of the second conductive pillars is larger than a height of the first conductive pillars.

15. The semiconductor package of claim 12, wherein the second contact pads are at least partially recessed below a surface of the substrate.

16. The semiconductor package of claim 15, wherein the second contact pads are disposed in a first recess of the substrate, and wherein the first semiconductor device is disposed in the first recess of the substrate.

17. A semiconductor package comprising:
first contact pads over a first side of a substrate;
second contact pads over the first side of the substrate, wherein the first contact pads and the second contact pads physically contact a same planar surface of the substrate;
a first semiconductor device covering the second contact pads, wherein the first semiconductor device has a functional circuit comprising an active device, wherein the first semiconductor device comprises third contact pads on a first side of the first semiconductor device facing away from the substrate, wherein a second side of the first semiconductor device opposing the first side of the first semiconductor device is attached to the first side of the substrate, wherein the first contact pads are laterally removed from the first semiconductor device;
a plurality of conductive channels extending through the first semiconductor device, wherein the conductive channels are electrically connected to the second contact pads and extend above the first side of the first semiconductor device, wherein there is no conductive channel between the substrate and the third contact pads of the first semiconductor device;

a second semiconductor device over the first semiconductor device and having first conductive pillars and second conductive pillars, wherein a first portion of the second semiconductor device is electrically connected to the third contact pads via the first conductive pillars, and a second portion of the second semiconductor device is electrically connected to the first contact pads via the second conductive pillars, wherein a width of the second conductive pillars is larger than a width of the first conductive pillars; and a third semiconductor device over the first semiconductor device, wherein a first portion of the third semiconductor device is electrically connected to the third contact pads, and a second portion of the third semiconductor device is electrically connected to the conductive channels.

18. The semiconductor package of claim 17, wherein a first portion of the conductive channels extends from the second contact pads to the first side of the first semiconductor device, and a second portion of the conductive channels extends above the first side of the first semiconductor device toward the third semiconductor device, wherein a width of the first portion of the conductive channels increases continuously along a direction from the second side of the first semiconductor device to the first side of the first semiconductor device.

19. The semiconductor package of claim 18, wherein the second conductive pillars are connected to power signals or ground signals.

20. The semiconductor package of claim 17, wherein a first distance between the first side of the first semiconductor device and a surface of the second semiconductor device facing the substrate is the same as a second distance between the first side of the first semiconductor device and a surface of the third semiconductor device facing the substrate.

* * * * *